(12) United States Patent
Stubbs

(10) Patent No.: US 6,667,911 B2
(45) Date of Patent: Dec. 23, 2003

(54) HIGH SPEED MEMORY ARCHITECTURE

(75) Inventor: Eric T. Stubbs, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/973,860

(22) Filed: Oct. 11, 2001

(65) Prior Publication Data

US 2003/0072183 A1 Apr. 17, 2003

(51) Int. Cl.[7] .................................................. G11C 7/00
(52) U.S. Cl. ................................. 365/189.05; 365/221
(58) Field of Search .............................. 365/189.05, 221

(56) References Cited

U.S. PATENT DOCUMENTS 6,031,785 A * 2/2000 Park et al. ............. 365/189.05
6,335,889 B1 * 1/2002 Onodera ..................... 365/221

* cited by examiner

Primary Examiner—Huan Hoang
(74) Attorney, Agent, or Firm—Dickstein Shapiro Morin & Oshinsky LLP

(57) ABSTRACT

A method and apparatus for storing and retrieving data in a second, or higher, order prefetch architecture memory integrated circuit. The method includes storing multiple bits of data in memory cells at various electrical distances from an output buffer and retrieving those memory bits concurrently for output. By outputting the bits in a fixed burst order, according to which a bit from a memory cell closer to the output buffer is output before a bit from a memory cell farther from the output buffer, the output time of the data bit from the closer memory cell can be used to mask a portion of the transit time of the bit from the farther memory cell. The apparatus includes memory cells at various locations for storing data bits, an address decoder adapted to store and retrieve multiple bits in a fixed burst order, and a multiplexer.

8 Claims, 6 Drawing Sheets

HIGH SPEED MEMORY ARCHITECTURE

BACKGROUND OF THE INVENTION

1. Field of the Invention

The present invention relates generally to digital memory devices and, more particularly, to semiconductor memory devices that store and retrieve data from memory cells according to a fixed data burst order.

2. Description of the Related Art

A digital memory, such as a dynamic random access memory (DRAM) has a memory array consisting of a number of individual m-bits or memory cells. Each working cell is adapted to store one binary digit (bit) of data. In a conventional DRAM device each memory cell consists of one transistor and one capacitor. A terminal of the transistor is connected to a column line (or digit line) of the memory device. Another terminal of the transistor is connected to a terminal of the capacitor and the gate terminal of the transistor is connected to a row line of the memory device. The transistor acts as a gate between the column line and the capacitor. When data is read from the cell, the terminal of the capacitor is electrically connected to the column line and the charge state of the capacitor affects the voltage on the column line, thereby indicating the stored logical value for readout.

In many integrated circuit memory applications, the time required for data retrieval is an important design consideration. The ability to consistently and rapidly retrieve stored data is of immediate technical and commercial value. Accordingly, rapid data retrieval is very desirable, and many efforts have been made to reduce access times. These efforts have addressed device design, manufacturing processes, and integrated circuit system architectures.

In a memory integrated circuit, a select signal must be communicated from an address decoder to a memory cell within a memory array. Thereafter, data to be output must be communicated from the memory cell to an output buffer that drives an output connection of the circuit. As would be understood by one of ordinary skill in the art, communicating a select signal assumes that a row has been opened and, includes triggering sense amplifiers, activating a DQ, and selecting a column. Connecting pathways between an accessed memory cell and an output buffer generally include a sense amplifier, a digit line trace that connects a cell to the sense amplifier, an I/O line trace that connects the sense amplifier to a mux/demux, and a further I/O line trace that connects the mux/demux to the output buffer. Typically, the data transfer is initiated synchronously with transitions of a clock signal. The data is provided from the memory cell in the form of electrical data signals transferred along conductive column lines and I/O traces to an output buffer. Typically, the data is output from the output buffer synchronously with a further transition of the clock signal. Generally, the data signal to be output must have traversed the device and stabilized at the output buffer prior to the further transition of the clock signal. Otherwise, there is a risk that the value output from the buffer will not properly reflect the data value stored in the memory cell. Therefore, digital memory devices are limited in speed by the time taken for signals to traverse the device from an address decoder to a memory cell, and from the memory cell to an output buffer. While this delay is small in human terms, it is significant in the context of many systems in which memory integrated circuits are applied. There is, therefore, a need to reduce the detrimental effect of this delay.

Improvements in memory speed have been achieved by various data retrieval schemes. One such scheme is embodied in a double data rate random access memory that exemplifies a second order (or 2N) prefetch memory architecture.

In a first order (1N) memory architecture integrated circuit device, a read signal is followed by an output of data. The output of data typically consists of a bit or a plurality of parallel bits on respective data paths. The recovered data is all put out on an attached data bus at the same time. Thereafter, no additional data is output until a further read signal requests additional data.

In an architecture of order greater than one (e.g., 2N, 4N, etc.), a read signal is followed a data burst on each data path. The data burst includes two or more data bits (e.g., 2N=2 data bits, 4N=4 data bits, etc.), which are output in sequence. Unlike a first order system, more than one successive data output occurs between consecutive read request signals.

Physical read latency denotes the finite amount of time required for data to be retrieved from an array location following a read column access. This delay is due to the physical constraints of the circuit. For example the RC time constant associated with the row line between the row address decoder and a particular memory cell determines transit time through the row line. Similarly, the RC time constants of lines between the addressed memory cell and the output buffer contribute to read latency. Typically, physical read latency is on the order of 15–20 ns.

The clock cycle latency of a system denotes a rule that requires that the first bit of data from a read access will be available at the output of the device a specified number of clock cycles after a read request is made. For example, for a device with the physical read latency of 20 ns, a clock latency (rule) of 2.5 requires that the clock signal have a maximum frequency of 125 MHz (20 ns/2.5 clock cycles=8 ns/clock cycle: yields a frequency of 125 MHz). In a further example, for a device with a 20 ns physical read latency, and a clock cycle latency of 2, the maximum clock frequency for reliable operation is 100 MHz.

In a conventional device, the slowest bit in the array (i.e. the bit exhibiting the highest physical read latency) determines the maximum permissible operating frequency of the device clock signal for a given value of clock cycle latency, or the number of clock cycles required before read data can be output.

The magnitude of the physical read latency of a particular memory cell depends on several factors, including RC time constants, the spatial length of the conductors connecting the address decoder to the memory cell and the spatial length of the conductors connecting the cell to the device output. Together, these factors make up what is called the electrical length traveled by the access and data signals during a data read.

SUMMARY OF THE INVENTION

The present invention overcomes problems associated with the prior art and provides a method and apparatus for more rapidly retrieving data stored in a digital memory.

In one aspect, the invention includes a method of increasing the effective speed at which data is output from a memory integrated circuit. The method is applicable to memory integrated circuits that include second order (2N) and higher order prefetch architectures in which data bits are sequentially sent in a burst on each data path. According to one aspect of the invention, a plurality of binary digits (bits), in a burst are stored so that a preceding bit has a shorter electrical path lengh to an output buffer than a succeeding bit. During read out a preceding data bit has a shorter electrical path length to the output buffer than a succeeding bit. A multiplexer/demultiplexer (mux/demux) receives the stored data bits from the plurality of memory cells in burst order.

After retrieval, the data is transferred from the mux/demux to an output buffer and output from the output buffer in a fixed order, such that the first data bit is output prior to the output of the last data bit. This consistent order of output is referred to as a fixed burst order. According to one aspect of the invention, an electrical length of a data path between the first memory storage cell, storing an early bit in a data burst, and an output buffer is shorter than an electrical length between a memory storage cell, storing a subsequent bit of the burst, and the output buffer. As a result, the first data bit arrives at the output buffer location, and may be output from the output buffer without having to wait a time period corresponding to the additional time it would take a bit from a memory cell electrically farthest from the output buffer to reach the buffer.

The present invention, therefore, improves on a conventional second or higher order prefetch architecture by requiring that data is stored, and subsequently retrieved for output in a particular order, referred to as a fixed burst order which is related to the distance of the memory cells storing the sequential bits of a burst. According to this order, the first data bit to be output is stored at a location that is electrically closer to the output buffer than the second data bit to be output. The second data bit to be output is stored at a location that is electrically closer than the third bit to be output, and so on for each bit of a data burst.

Electrical distance reflects the time that it takes for a signal to travel from one end of a conductor to the other. This time depends on the length of the conductor, and on its impedance. Higher capacitance, higher resistance, and higher inductance all tend to slow signal transmission speed and increase signal transmission time. Accordingly, for example, between two conductors of equal geometric length, the conductor with the higher capacitance will have the longer electrical length.

In view of the foregoing discussion, it will be clear that a further aspect of the invention includes an integrated circuit memory device with a multiplexer/demultiplexer (mux/demux). The mux/demux is adapted to receive and output multiple data bits of a burst on a data path in serial, one bit at a time. Beyond the mux/demux, an output buffer amplifies the data signal for output from the integrated circuit. The cells are located at various electrical distances from the mux/demux depending on the order of output in a burst with a preceding bit of a burst being located electrically closer to the output buffer than a subsequent bit.

The above and other features and advantages of the invention can be more clearly seen from the following detailed description which is provided in connection with the accompanying drawings.

DETAILED DESCRIPTION OF THE PREFERRED EMBODIMENTS

The present invention will be described as set forth in the exemplary embodiments illustrated in the figures attached hereto. Other embodiments may be utilized and structural or logical changes may be made without departing from the spirit or scope of the present invention.

Figure 1:
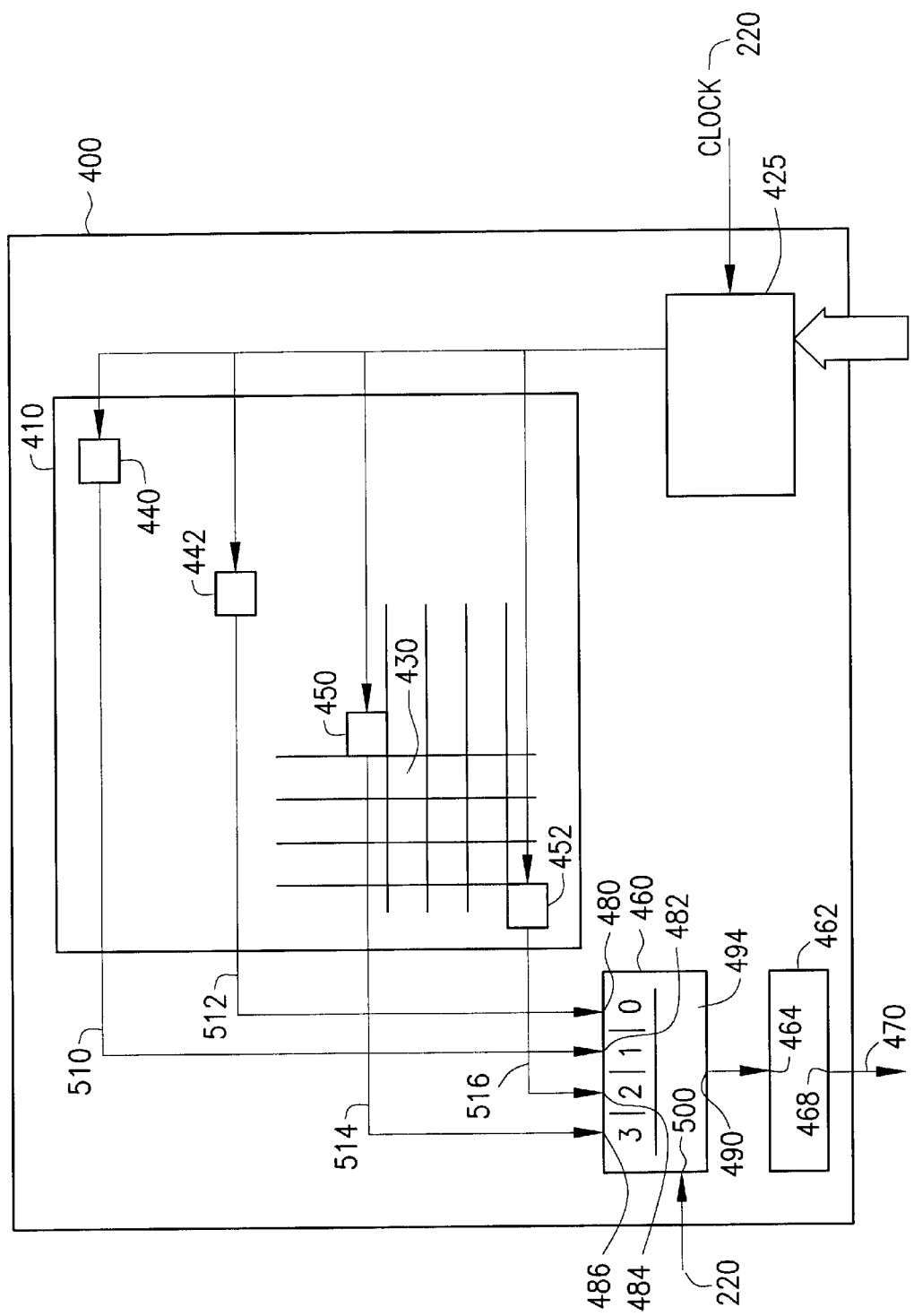
FIG. 1 illustrates in block-diagram form an embodiment of a conventional fourth order architecture digital memory device.

FIG. 1 illustrates, in simplified form, a conventional fourth order memory system. In the fourth-order memory architecture, four bits are selected from a single data quadrant (DQ) and routed to an output buffer in response to every read request. After arriving at the output buffer, these bits are output at subsequent rising and falling edges of a clock signal. Accordingly, FIG. 1 shows a memory integrated circuit 400 including a memory array DQ 410 made up of a large number of substantially identical cells 430. Four particular cells are identified as 440 and 442, 450 and 452, respectively.

An address decoder 425 is operatively connected to the array DQ 410 for selecting cells. As noted above, one of skill in the art would understand that the addressing scheme illustrated is simplified to emphasize the novel aspects of the present invention. In fact, selection of a particular memory cell involves decoding a row address with a row address decoder to open a row, selecting a DQ data path, decoding a column address with a column address decoder, and selecting a column, to place a data value stored in the memory cell on an I/O line.

A four-bit mux/demux 460 serves to clock data to an output buffer 462, connected to an external data line 470, in synchronous fashion. The mux/demux 460 is adapted to receive four bits substantially in parallel, and to output those four bits, one at a time, in serial fashion. Accordingly the mux/demux includes first 480 second 482, third 484, and fourth 486 data inputs, control circuitry 494, a single data output 490, and a clock input 500. The data inputs 480, 482, 484, and 486 are connected to an internal data bus having four data lines 512, 510, 516, and 514. The data output 490 is connected to a data input 464 of an output buffer 462. The output buffer 462 includes a data output 468 connected to an external data line 470. In operation, four bits are received at the respective inputs 480, 482, 484, and 486 of the mux/demux 460. A first transition of the clock signal 220 applied to the mux/demux clock input 500 causes the data value at the first input 480 to be transferred to the output buffer 462. A second transition of the clock signal 220 causes the data value at the second input 482 to be transferred to the output buffer 462. A third transition of the clock signal 220 causes the data value at the third input 484 to be transferred, and a fourth transition of the clock signal 220 causes the data value at the fourth input 486 to be transferred to the output buffer 462. As each data bit is transferred to the output buffer, it is output by the buffer. The described order in which data bits are output, is referred to as burst order.

In a conventional fourth order memory, the burst order of the data bits output from the buffer 460 is not chosen to reflect the electrical distance between the memory cells in which the bits originate and the output buffer. In the illustrated example, cell 442 provides the first-output data bit in the data burst, whereas cell 452, which is closer than cell 442 to the output buffer, provides the data bit that is output third in the data burst.

Figure 2:
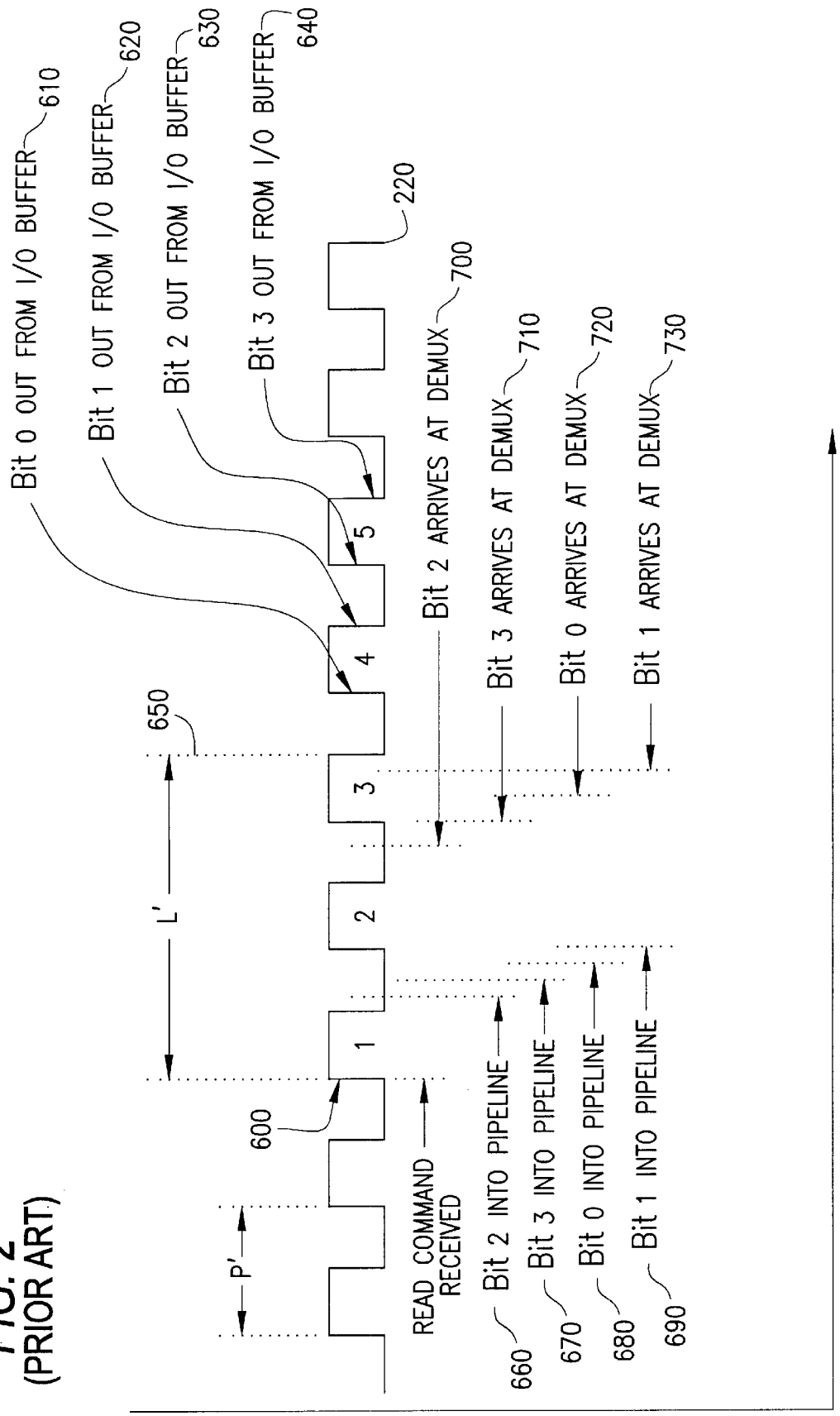
FIG. 2 illustrates timing relationships for a convention fourth order architecture digital memory device.

Referring to FIG. 2, a periodic clock signal 220 provides transitions for clocking data through the mux/demux 460. The read signal at time 600 causes the closest cell 452 to release its data (bit 2) onto data line 516 at a first-time 660. Thereafter, the data bit in cell 450 (bit 3) is released onto respective data line 514 at a later time 670. Still later, cell 442 (bit 0) releases its data onto data line 512 at time 680, and finally cell 440 releases its data (bit 1) onto data line 510 at time 690. Sometime after the release 660 of data by cell 452 onto data line 516, that data (bit 2) arrives at input 484 of the mux/demux 460 at time 700. In a similar fashion, the data from the other memory cells ripples into the mux/demux. Accordingly, after the data (bit 2) from cell 452 arrives at time 700, the data (bit 3) from cell 450 arrives at time 710, followed by the data (bit 0) from cell 442 at time 720, and followed by the data (bit 1) from cell 440, at time 730. The system illustrated is a fourth order system because a single read signal received at one time 600 retrieves data from four different cells for serial output on a single I/O line. That data is then output on the I/O line 470 at four successive rising clock transitions 610, 620, 630, 640.

As illustrated in FIG. 1, the electrical distance between a memory cell and the output buffer is not reflected in the burst order of the data bits output from the mux/demux 460. Cell 442 provides the data bit first output in a data burst, whereas cell 452, which is closer than cell 442 to the output buffer, provides the data bit that is output third in the data burst. Since it is unknown whether the first-output data bit will come from a cell that is near to, or far from, the output buffer, the frequency of the clock signal 220 must be selected such that the clock cycle latency L 650 (here, 2½ clock cycles) is long enough to allow a signal from the most electrically remote memory cell to stabilize at the mux/demux before the data is transferred to the output buffer 462 and output. Alternately, a number of clock signals must be chosen which is greater than the physical read latency, that is, it is long enough to allow a signal from the most electrically remote memory cell to stabilize at the mux/demux before the data is transferred to the output buffer 462 and output. This guarantees that a data bit from the most electrically remote memory cell 440 will be properly set up at the input of the mux/demux 460 when the state of input is transferred to output 490, and that output of the device will be reliable. Therefore, the duration of the initial latency period L' 650 remains the same as that of a comparable first-order system. Both the first order system and the fourth order system must wait the same duration after the read command is received before outputting a bit from the output buffer, in case the bit to be output is coming from the memory cell that is electrically farthest from the output buffer.

Figure 3:
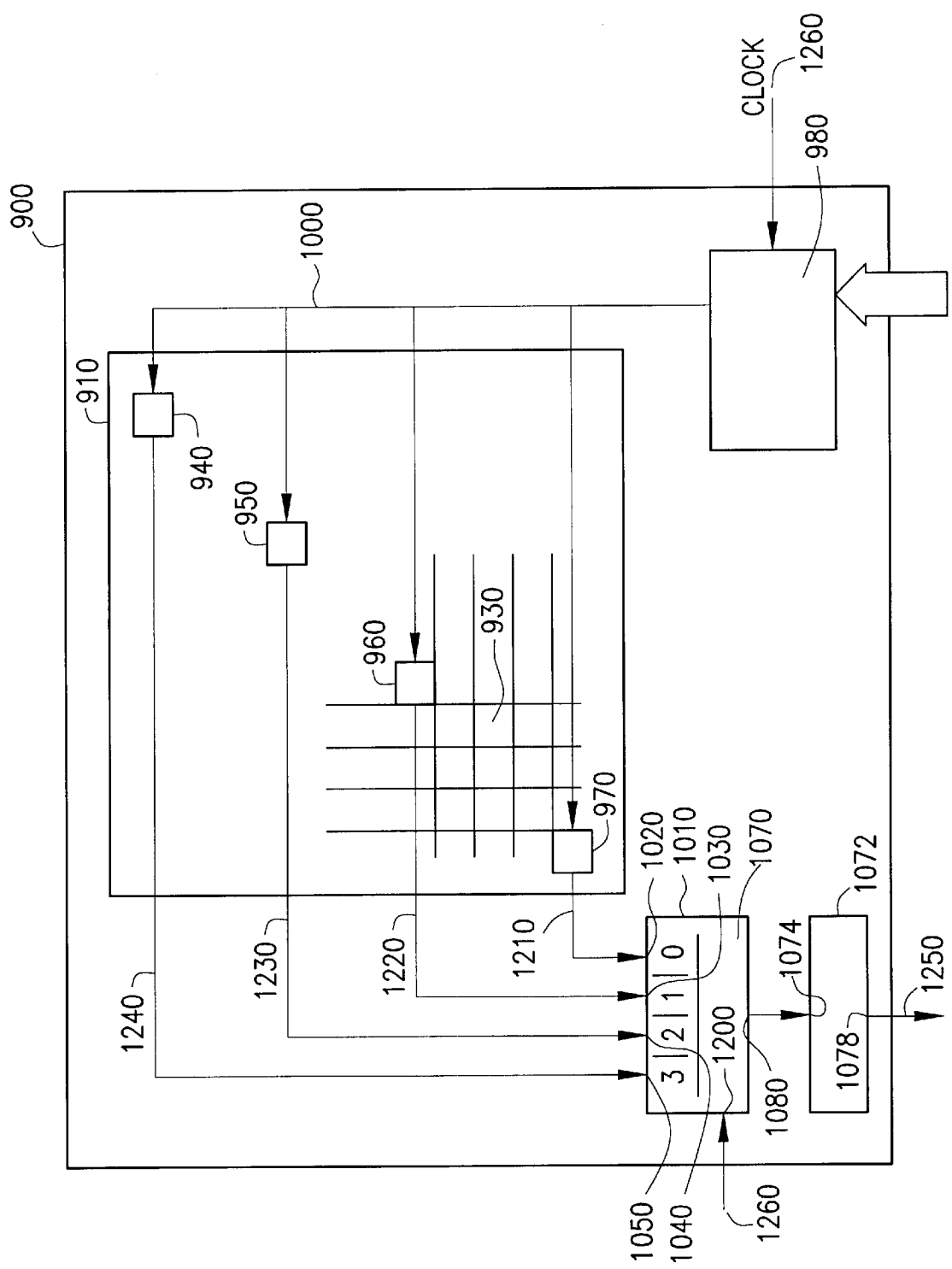
FIG. 3 illustrates a fourth order architecture digital memory device according to the invention.

The present invention overcomes this constraint by implementing a novel data storage arrangement including a determinate burst order. Referring to FIG. 3, an integrated circuit memory device 900 constructed in accordance with one embodiment of the invention is shown. The integrated circuit includes a memory array 910 with a large number of substantially identical cells 930. Four particular cells are identified, a first cell 940, a second cell 950, a third cell 960, and a fourth cell 970. An address decoder 980 is operatively connected to the array 910 for selecting cells by means of select line conductors 1000. As discussed above, one of skill in the art would understand that the address decoder includes both a row address decoder and a column address decoder, each separately connected to each memory cell. Also illustrated is a mux/demux 1010. The first cell 940 is electrically more remote from the mux/demux 1010 and hence from an output buffer 1072 than the fourth cell 970. For purposes of this example, cell 940 is the most electrically remote of all of the cells of the DQ 910.

As with the conventional fourth order architecture, discussed above, the mux/demux 1010 is adapted to receive four bits in parallel and to transfer those four bits to an output buffer 1072, one at a time, in serial fashion. Accordingly, the mux/demux 1010 includes first 1020, second 1030, third 1040, and fourth 1050 data inputs, control circuitry 1070, a single data output 1080, and a clock input 1200. The data inputs 1020, 1030, 1040, and 1050 are connected to an internal data bus including four data lines 1210, 1220, 1230, and 1240. The data output 1080 is connected to a data input 1074 of the clocked output buffer 1072. The clocked output buffer 1072 includes a data output 1078 connected to an external data line 1250.

The present invention imposes an order limitation, called a fixed burst order, on the data storage system of an integrated circuit memory device in order to achieve operation at higher clock frequencies, or reduced clock cycle read latency. Data from the memory cell 970 that is electrically nearest to be output buffer 1072 is directed to the input 1020 of the mux/demux from which data is drawn first during a given data burst. Conversely, data from the memory cell 940 that is electrically farthest from the output buffer 1072 is directed to the input 1050 of the mux/demux 1010 from which data is drawn last during a given data burst. The order of digits in a given data burst, in one aspect of the invention, reflects a monotonic increase in the electrical distances between the output buffer and the memory cells in which the respective digits are stored. This fixed burst order insures that data from an electrically near cell determines the clock frequency specification or clock cycle read latency specification, of the integrated circuit memory device.

According to the present invention, a burst order of data is established at the time of data storage that places a bit to be output first in a location electrically nearest to the device output. The same burst order is adhered to on data retrieval with the result that the device read latency period specification is reduced.

Figure 4:
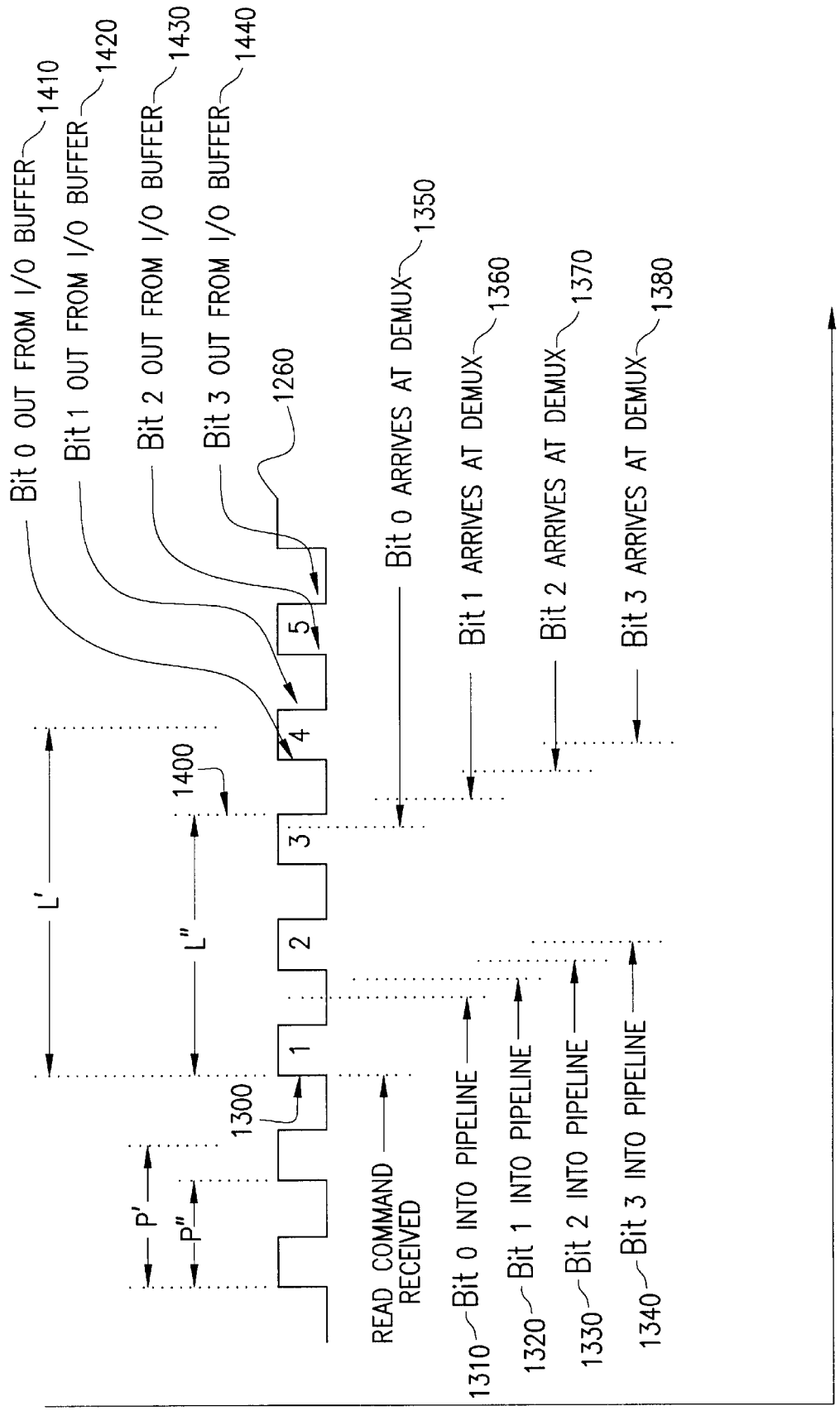
FIG. 4 illustrates timing relationships for a fourth order architecture digital memory device according to the invention.

FIG. 4 illustrates the timing relationships for the exemplary memory integrated circuit device of FIG. 3. A read command is received synchronously with a rising edge transition at time 1300 of a clock signal 1260. On receipt of the read command, a select signal is concurrently transmitted to each of four memory cells distributed at different locations across the integrated circuit. As illustrated in FIG. 3, each of the four memory cells 940, 950, 960, and 970 is at a different electrical distance from an address decoder 980. Therefore, the select signal dispatched to the cells at time 1300 arrives at the various cells at different times, 1310, 1320, 1330, and 1340 respectively. When the select signal reaches 1310 the electrically nearest of the cells 970 it activates the cell. Thus at a particular time 1310, the logical value (bit 0) stored by cell 970 is placed on the respective data line 1210. This logical value traverses the data line 1210 to a particular input 1020 of the mux/demux 1010. According to the invention since this data bit is coming from the electrically nearest of the memory storage locations to the mux/demux 1010, the bit is directed to the input 1020 of the mux/demux from which the first bit of the data burst will be drawn. It arrives at the mux/demux 1010 at a particular time 1350. In similar fashion, the data bit (bit 1) from the next farthest memory cell 960 is directed to the input 1030 from which the second bit of the data burst will be drawn. This bit arrives at the mux/demux after the first bit at a time 1360. The data bit (bit 2) from the next memory cell 950 is directed to the input 1040 from which the third bit of the data burst will be drawn. This bit arrives at the mux/demux at a still later time 1370 and the data bit (bit 3) from the farthest memory cell 940 is directed to the input 1050 from which the last bit of the data burst will be drawn. This last bit arrives at the mux/demux at a time 1380.

The output of bits from the mux/demux begins at the first rising clock transition after the end of the clock cycle read latency period L". Accordingly, the first bit, from memory cell 970, is output at a first time 1410, at the first rising transition of the clock signal 1260 after the 2½ clock cycle latency period 1400. One half clock cycle later 1420, the second bit, from memory cell 960 is output. One half cycle later 1430, the third bit is output, and one half cycle after that 1440, the fourth bit is output.

By segregating the data bits, within the recovered data, into bits from relatively proximate and relatively distant cells respectively, and defining a burst order that ensures that data from relatively proximate cells is output prior to data from relatively distant cells, it is possible to reduce read latency and increase the overall frequency of the system clock signal 1260.

In the examples shown, both the conventional fourth order device and that of the present intervention are programmed for a clock cycle latency of 2½ clock cycles. Since the first bit of the output data burst is guaranteed to be stable sooner for the invention, the 2½ cycles of the invention clock corresponds to a shorter time than the 2½ cycles of the conventional device clock. Put another way, the device of the invention can operate at a higher clock frequency and shorter clock period P" than that of the conventional device P'. Since it operates at a higher clock frequency the memory device of the present intervention provides faster data retrieval that an otherwise comparable conventional device.

It should also be noted that this benefit is scalable, and that as long as a fixed burst order is maintained an architecture of any order of 2N or larger may be arranged to benefit from reduced clock cycle read latency or a shortened clock period, as described above.

Figure 5:
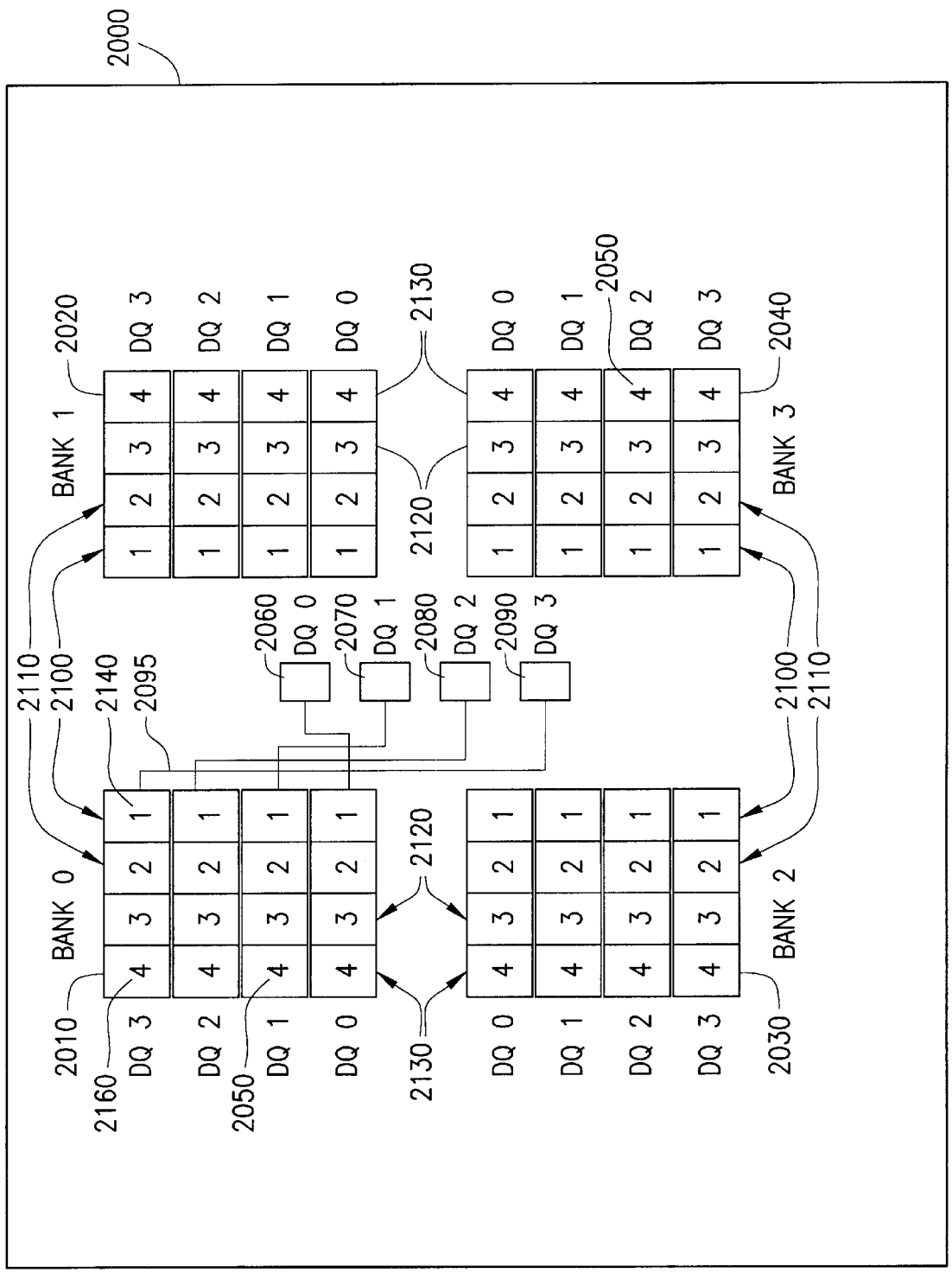
FIG. 5 illustrates an exemplary fourth order by four bank architecture digital memory device according to the invention.

A further aspect of the invention is illustrated in FIG. 5, which shows an exemplary 4 Bank, 4N prefetch DRAM 2000 in a x4 configuration with fixed burst order. The DRAM 2000 includes four banks 2010, 2020, 2030, 2040 of substantially identical memory cells, e.g. 2050. The DRAM also includes first 2060, second 2070, third 2080, and fourth 2090 I/O buffer locations.

According to one aspect of the invention, a read command is valid soonest for data from region 1 2100, followed by data from region 2 2110, followed by region 3 2120, followed by region 4 2130. Data from any one of the region 1 cells, e.g. 2140 is received at the corresponding I/O buffer location 2090 prior to the arrival of data from the respective region 4 cell 2160 at the corresponding I/O buffer location 2090.

In the illustrated embodiment, the digital memory includes a 4-bit wide data pipeline per DQ output data path, e.g., 2095. As compared with a prior art memory having a 4-bit wide data pipeline, the memory of the invention has a read cycle time limited by the slowest, i.e. the most remote of the cells of region 1 2100 rather than the slowest of the cells of region 4 2130.

Figure 6:
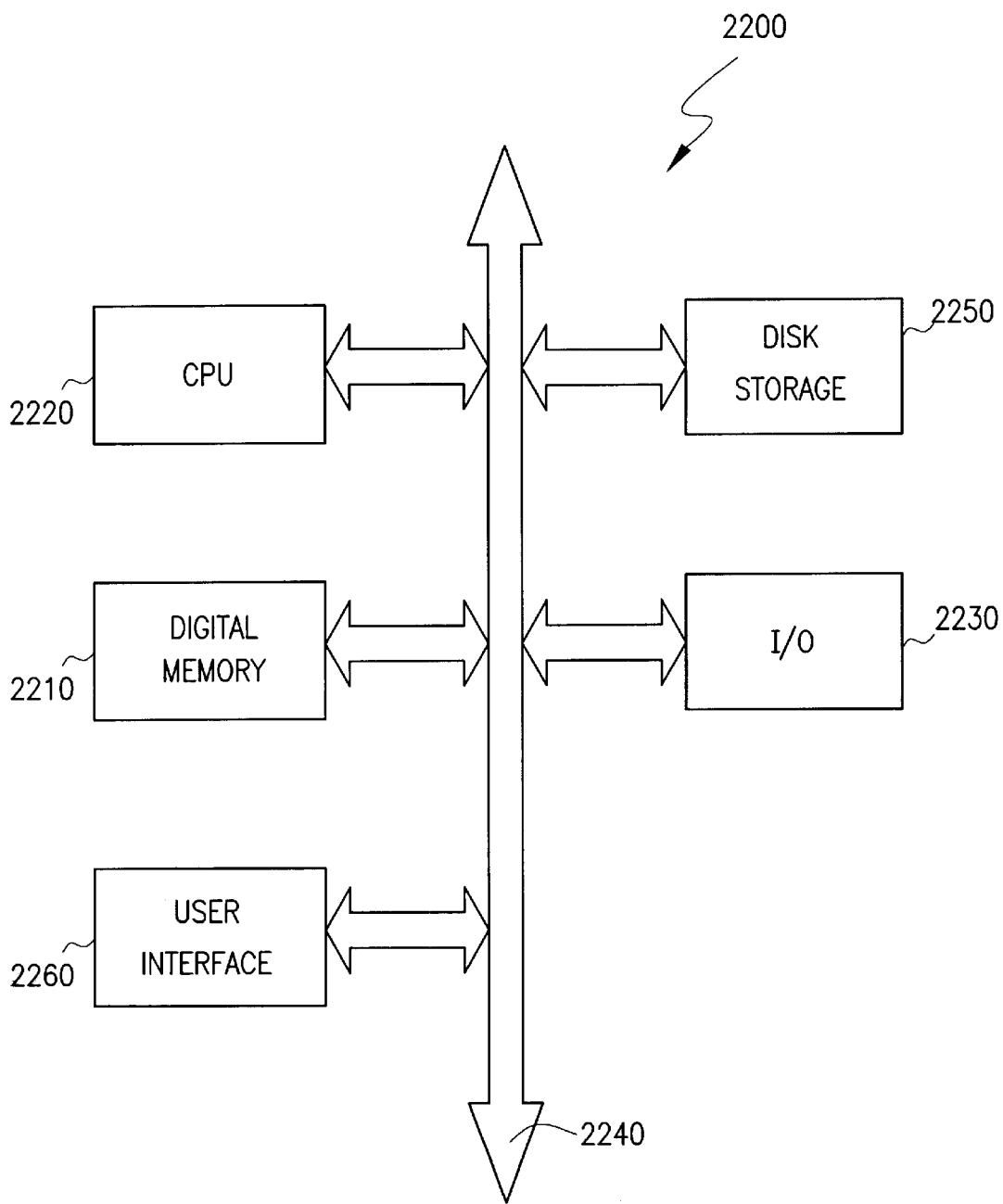
FIG. 6 illustrates a computer system including a memory according to the invention.

FIG. 6 shows a computer system 2200 including a digital memory 2210 constructed according to one aspect of the invention. The computer 2200 includes a central processing unit (CPU) 2220, for example, a microprocessor, that communicates with one or more input/output (I/O) devices 2230 over a bus 2240. The computer system also includes peripheral devices such as disk storage 2250 and a user interface 2260. It may be desirable to integrate the processor and memory on a single IC chip.

It is clear that the novel aspects of the present invention may be applied to memory devices having arbitrary degrees of parallel structure, and having clock cycle latencies of an arbitrary number of clock cycles. Other processing systems in which the invention, in different embodiments may be employed include radio systems, television systems, wireless, wired, and optical voice and data networks, Global Positioning System receivers, and other systems where digital data storage is required.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A method of reading a digital memory comprising:

receiving, at an output buffer, a first data bit of a data burst from a location at a first electrical distance from said output buffer;

receiving, at said output buffer, a second data bit from a second location at a second electrical distance from said output buffer, said second distance larger than said first distance;

receiving, at said output buffer, a third data bit from a third location at a third electrical distance from said output buffer, said third distance larger than said second distance; and outputting from said buffer said first data bit, said second data bit, and said third data bit consecutively.

2. A method of storing data for rapid retrieval comprising:

storing first, second and third data bits at first, second and third locations respectively according to a storage rule, said storage rule specifying that a first-to-be-output one of said first, second and third bits is stored electrically closer to an output buffer than a second-to-be-output one of said first, second and third bits, and said second-to-be-output one of said first, second and third bits is stored electrically closer to said output buffer than a third-to-be-output one of said first, second and third bits.

3. A method of reading data from a memory integrated circuit comprising:

receiving an address at an input of an address decoder;

decoding said address within said address decoder;

selecting a plurality of memory storage locations with said address decoder;

receiving a plurality of data bits, one from each location of said plurality of storage locations respectively;

defining an output order for said plurality of data bits, said output order defining the order of at least first, second and third data bits such that said first data bit travels a shorter electrical distance between said respective storage location and an output buffer than said second data bit travels between said respective storage location and said output buffer and said second data bit travels a shorter electrical distance between said respective storage location and said output buffer than said third data bit travels between said respective storage location and said output buffer; and sequentially outputting said plurality of data bits in said defined order.

4. A method of outputting data comprising:

storing a first data bit in a first cell at a first location;

storing a second data bit in a second cell at a second location;

storing a third data bit in a third cell at a third location;

said second location being electrically farther from an output buffer than said first location and said third location being electrically farther from said output buffer than said second location;

said first, second and third cells adapted to being logically defined by a single address;

receiving said address at an address decoder;

concurrently signaling said first, second and third cells according to said address; and outputting said first data bit from said output buffer and subsequently outputting said second data bit from said output buffer and subsequently outputting said third data bit from said output buffer.

5. An integrated circuit memory storage device comprising:

means for outputting a plurality of bits of data in a particular order such that a first bit of said plurality is output first, a second bit of said plurality is output second and a third bit of said plurality is output third, said outputting means disposed on an integrated circuit substrate assembly;

means for storing said plurality of data bits at a respective plurality of storage locations disposed on said integrated circuit substrate assembly at locations successively more distant from said outputting means; and addressing means for receiving a single address signal and responsively transferring said plurality of data bits consecutively from said respective plurality of locations.

6. A memory integrated circuit device comprising:

an address decoder circuit adapted to receive an address signal;

first, second and third memory storage circuits adapted to store first, second and third data values respectively, each said memory storage circuit operatively connected to said address decoder circuit so as to receive from said address decoder circuit a respective select signal sent concurrently to said first, second and third storage circuits; and a data output circuit operatively connected to said first, second and third memory storage circuits adapted to receive said first, second and third data values from said first, second and third memory storage circuits respectively, said data output circuit adapted to output said respective received data values, said data output circuit being electrically closer to said first memory storage circuit than said second memory storage circuit and electric the closer to said second memory storage circuit than said third memory storage circuit, said data output circuit adapted to output said first data value from said first memory storage circuit before outputting said second data value from said second memory storage circuit and to output said second data value from said second memory storage circuit before outputting said third data value from said third memory storage circuit, whereby said first output may occur prior to said receipt of said second data value at said data output circuit and said second output may occur prior to said receipt of said third data value at said data output circuit.

7. A memory integrated circuit device comprising:

means for receiving a memory address from an external address source;

a plurality of memory bit storage locations, said locations corresponding to said memory address;

means for decoding said memory address;

means for retrieving a plurality of bits of data concurrently from said plurality of memory bit storage locations respectively according to said decoded address;

means for outputting said plurality of bits serially in a particular order such that a first bit output of said plurality is a bit stored at one of said storage locations electrically closer to said outputting means than a second bit of said plurality, which second bit is stored at one of said storage locations electrically closer to said outputting means than a third bit of said plurality.

8. A method of storing data to be retrieved and output in a single read cycle of an integrated circuit memory device comprising:

storing a first-to-be-output data value in a first memory cell of said memory device at a first electrical distance from an output buffer of said memory device;

storing a second-to-be-output data value in a second memory cell of said memory device at a second electrical distance from said output buffer; and storing a third-to-be-output data value in a third memory cell of said memory device at a third electrical distance from said output buffer, wherein said third electrical distance is always longer than said second electrical distance and said second electrical distance is always longer than said first electrical distance.

* * * * *